(12) United States Patent
Steenhoff

(10) Patent No.: US 12,101,056 B2
(45) Date of Patent: Sep. 24, 2024

(54) SWITCHABLE ABSORBER ELEMENT AND PHOTOVOLTAIC CELL

(71) Applicant: Deutsche Zentrum Für Luft- Und Raumfahrt E.V., Bonn (DE)

(72) Inventor: Volker Steenhoff, Oldenburg (DE)

(73) Assignee: DEUTSCHE ZENTRUM FÜR LUFT- UND RAUMFAHRT E.V., Bonn (DE)

( * ) Notice: Subject to any disclaimer, the term of this patent is extended or adjusted under 35 U.S.C. 154(b) by 208 days.

(21) Appl. No.: 17/050,180

(22) PCT Filed: Apr. 24, 2019

(86) PCT No.: PCT/EP2019/060457
§ 371 (c)(1),
(2) Date: Oct. 23, 2020

(87) PCT Pub. No.: WO2019/206957
PCT Pub. Date: Oct. 31, 2019

(65) Prior Publication Data
US 2021/0111667 A1 Apr. 15, 2021

(30) Foreign Application Priority Data
Apr. 26, 2018 (DE) .......................... 102018206516.0

(51) Int. Cl.
*H02S 40/22* (2014.01)
*E06B 9/24* (2006.01)
(Continued)

(52) U.S. Cl.
CPC ............... *H02S 40/22* (2014.12); *E06B 9/24* (2013.01); *F24S 50/80* (2018.05); *F24S 70/60* (2018.05);
(Continued)

(58) Field of Classification Search
CPC . G02F 1/17; G02F 1/213; H01L 31/00; H01L 31/032; H01L 31/0376;
(Continued)

(56) References Cited

U.S. PATENT DOCUMENTS 7,633,581 B2 * 12/2009 Sikharulidze ........... G02F 1/167
349/115
2004/0155154 A1 * 8/2004 Topping ................. G01K 11/14
374/E11.02

(Continued)

FOREIGN PATENT DOCUMENTS

DE 102013217653 A1 3/2015
JP 2014212273 A 11/2014

OTHER PUBLICATIONS

Lance M. Wheeler et al., "Switchable Photovoltaic Windows Enabled by Reversible Photothermal Complex Dissociation from methylammonium Lead Iodide", Nature Communications, vol. 8, No. 1, Nov. 23, 2017, pp. 1-9.
(Continued)

Primary Examiner — Jie Lei
(74) Attorney, Agent, or Firm — International IP Law Group, PLLC

(57) ABSTRACT

The invention relates to a switchable absorber element and a photovoltaic cell based thereon. A switchable absorber element according to the invention has an absorber layer. The absorber element furthermore has at least one front side reflection layer and at least one rear side reflection layer, wherein the absorber layer is arranged between front side reflection layer and rear side reflection layer, wherein the optical path length between front side reflection layer and rear side reflection layer is less than 400 nm at least for light impinging perpendicularly onto the cell. The absorber ele-
(Continued)

ment according to the invention is characterized in that at least one of the reflection layers has a switchable reflectivity.

13 Claims, 3 Drawing Sheets

(51) Int. Cl.
*F24S 50/80* (2018.01)
*F24S 70/60* (2018.01)
*G02F 1/17* (2019.01)
*H01L 31/032* (2006.01)
*H01L 31/0376* (2006.01)
*H02S 20/26* (2014.01)
*H02S 40/44* (2014.01)

(52) U.S. Cl.
CPC .............. *G02F 1/17* (2013.01); *H01L 31/032* (2013.01); *H01L 31/03762* (2013.01); *H02S 20/26* (2014.12); *H02S 40/44* (2014.12); *E06B 2009/2417* (2013.01)

(58) Field of Classification Search
CPC ... H01L 31/03762; H02S 40/22; H02S 40/44; H02S 20/26; F24S 50/80; F24S 70/60; E06B 9/24; E06B 2009/2417
USPC ................ 359/240, 247, 614, 275, 885, 891
See application file for complete search history.

(56) References Cited

U.S. PATENT DOCUMENTS

2009/0159123 A1 6/2009 Kothari et al.
2012/0167964 A1 7/2012 Tseng et al.

OTHER PUBLICATIONS

Lin Jia et al., "Thermochromic Halide Perovskite Solar Cells", Nature Materials, vol. 17, No. 3, Jan. 22, 2018, pp. 261-267. Abstract.
Muhammad Saifullah et al., "Comprehensive Review on Material Requirements, Present Status, and Future Prospects for Building-Integrated Semitransparent Photovoltaics (BISTPV)", J. of Mat. Chem. A, vol. 4, No. 22, 2016, pp. 8512-8540. Abstract.
Naorem Rameshwari et al., "Thermally Switchable metamaterial absorber with a V02 Ground Plane", Optics Communications, Feb. 14, 2015, pp. 154-157. Abstract.
Volker Steenhoff, "Development of Amorphous Germanium Nanoabsorber Solar Cells," Retrieved from: http://oops.uni-oldenburg.de/2872/1/stedev16.pdf, May 31, 2016, pp. 1-78.
Volker Steenhoff, "Nanoabsorbers for PV: New Potential Applications," Proc. of the 35th EU-PVSEC, Sep. 24, 2018, pp. 51-54. Abstract.
W. Gao et al., "A Wide-Gap a-SiC:H PV-Powered Electrochromic Window Coating," 2nd World Conference and Exhibition on Photovoltaic Solar Energy Conversion, Jul. 1998, pp. 234-237.
"International Search Report and Written Opinion Issued in PCT Application No. PCT/EP2019/060457", Mailed Date: Jul. 19, 2019, 10 Pages.
"International Preliminary Report on Patentability Issued in PCT Application No. PCT/EP2019/060457", Mailed Date: Oct. 26, 2020, 16 Pages.
W. Gao, et al., "A Wide-Gap a-SiC:H PV-Powered Electrochromic Window Coating", 2nd World Conerence and Exhibition on Photovoltaic Solar Energy Conversion; Jul. 6-10, 1998, 5 pages.
Volker Steenhoff, et al., "Optimized Optical Field Profile in Resonant-Cavity-Enhanced a-Ge:H Nanoabsorber Solar Cells for Tandem Cell Application", IEEE Journal of Photovoltaics, vol. 7, Issue: 1, Oct. 31, 2016, 9 pages.

* cited by examiner

SWITCHABLE ABSORBER ELEMENT AND PHOTOVOLTAIC CELL

CROSS REFERENCE TO RELATED APPLICATIONS

Pursuant to 35 U.S.C. § 371, this application is the United States National Stage Application of International Patent Application No. PCT/EP2019/060457 filed Apr. 24, 2019, the contents of which are incorporated by reference as if set forth in their entirety herein, which claims priority to German Patent Application No. DE102018206516.0, filed Apr. 26, 2018, the contents of which are incorporated by reference as if set forth in their entirety herein.

BACKGROUND

Shading systems are used in many areas, e.g. in high-rise buildings with large window facades. For that purpose, known systems rely on mechanical shading, such as roller shutters or awnings. However, due to the many movable parts, mechanical shading systems are prone to failure and maintenance-intensive. There are already windows, which shade independently in response to temperature rise or illumination, or which the user can darken, e.g. electrically variably, without having to rely on mechanical shading thereby.

In the summer, buildings of this type typically heat up strongly and thus always require much energy for the climate control, when the need for shading is high as well. It would thus be highly advantageous to create a particularly large amount of energy, in particular in that moment when the need for shading is high.

Electrical energy can be generated from the light impinging onto the cell by means of a photovoltaic cell, also referred to as solar cell. For that purpose, solar cells have an absorber element, in which free charge carriers can be created by the supply of energy in the form of electromagnetic radiation.

Known shading systems, however, block light either by reflection or simple absorption, without thereby using the energy of the blocked light. Even though there are generally two systems, which produce heat or electricity in response to active shading, they are based on the combination of classical, mechanical shading components with solar heat or photovoltaics with the disadvantages, which have already been described above. Theoretically existing approaches, in which solar cells are combined with electrically switchable absorbers or mirrors, have the disadvantage that only small portions of the total surface are equipped with solar cells, which also only serve the purpose of generating the energy for the operation of the switchable shading, and simultaneously provide for an automatic switching in response to the irradiation of light. The surfaces provided with solar cells are light-impermeable or have a static shading, respectively. Additionally, the energy from the dynamically blocked light is lost.

A solar cell is known from the German patent application DE 10 2013 217 653 A1, which has a front side electrode and a rear side electrode as well as a photoelectrically active absorber layer, which is arranged between front and rear side electrode and which contains at least 30 percent by mass of germanium. The absorber layer has a thickness of less than 40 nm, wherein the solar cell has a front side reflection layer and a rear side reflection layer, wherein the absorber layer is arranged between front and rear side reflection layer, and the optical path length between front and rear side reflection layer is less than half of the path length, which corresponds to the bandgap of the absorber layer. The optical path length is thereby calculated from the product of refractive index and geometric path length. The solar cell has the advantage that the thickness of the absorber layer is reduced compared to known solar cells, wherein the absorption capacity is only slightly reduced.

SUMMARY

The invention relates to a switchable absorber element and a photovoltaic cell based thereon. It is the object of the invention to provide an absorber element, which can be switched for as long as possible and in a reversible manner with the largest possible stroke, wherein stroke is understood here and hereinafter as the difference between minimum absorption/maximum transmission and maximum absorption/minimum transmission. It is furthermore the object of the invention to provide a photovoltaic cell comprising an absorber element, which can be switched for as long as possible and in a reverse manner with the largest possible stroke.

A switchable absorber element according to the invention has an absorber layer. The absorber element furthermore has at least one front side reflection layer and at least one rear side reflection layer, wherein the absorber layer is arranged between front side reflection layer and rear side reflection layer, wherein the optical path length between front side reflection layer and rear side reflection layer is less than 400 nm at least for light impinging perpendicularly onto the cell. Here and hereinafter, the expression "front side" thereby refers to the side of the absorber element facing the light source, for example the sun, while here and hereinafter, the expression "rear side" refers to the side of the absorber element facing away from the light source. The optical path length can be calculated from the product of refractive index and the geometrical layer thickness. The absorber element according to the invention is characterized in that at least one of the reflection layers has a switchable reflectivity.

The thin absorber layer located between the at least two reflection layers, which reflect partially or completely, respectively, absorbs significantly less than 50% of the impinging light when passing through once. Resonances or stationary waves or multiple reflections, respectively, are created between the reflecting layers under certain conditions. Compared to the simple pass-through of the layer, this results in multiplied absorption. An absorber element of this type can contain germanium, for example. Provided that the absorber layer has a thickness, which is dimensioned such that the optical path length between front side reflection layer and rear side reflection layer is less than 400 nm at least for light impinging perpendicularly onto the cell, a broadband optical resonance forms between the front and rear side reflection layer, as a result of which the absorption in the absorber layer is increased significantly. If at least one of the reflection layers has a switchable reflectivity, the impinging light can either be transmitted for the most part or, in the other switching state, can be absorbed for the most part due to resonances, and can be used, for example, to create thermal and/or electrical energy. When turning off the reflectivity of at least one of the reflection layers, the resonance effects disappear almost completely, so that this light passes through the absorber layer only once and is transmitted for the most part. If, in contrast, the reflectivity of the reflection layers is turned on, the absorber layer is passed through repeatedly due to resonances or stationary waves, respectively, which leads to a high absorption and thus to a high stroke, wherein only little light is still transmitted and a shading effect thus occurs. The inventive setup of the switchable absorber element furthermore leads to an efficient charge carrier regeneration and to a high electrical energy yield, when the switchable absorber element is integrated into a photovoltaic cell, which furthermore has charge carrier-selective electrodes and at least one front side electrode and at least one rear side electrode as well as the absorber layer, which is arranged between front side electrode and rear side electrode, wherein the absorber layer is designed to be photoelectrically active.

Those materials or material combinations, respectively, which already ensure an absorption of at least approximately 5%, preferably of at least approximately 10%, and of maximally approximately 30%, preferably maximally approximately 20% for the light, which is reflected in the reflective mode by at least one of the switchable reflection layers, when passing through once, have proven to be advantageous as materials or material combinations, respectively, for the absorber layer. To attain a high absorption in the absorber layer by means of the multiple reflections, which form between the front side reflection layer and the rear side reflection layer in the reflective mode of the at least one switchable reflection layer thereof, the absorber layer already requires a certain, minimum absorption when passing through once, provided that it is not switchable itself. This minimum absorption should be so small that only little light is absorbed in the transmissive mode of the at least one switchable reflection layer, thus when passing through the absorber layer once, while a high absorption is achieved in the reflective mode of the at least one switchable reflection layer due to the resonances as a result of, for example, effectively passing through the absorber layer 10 times. When passing through once, the value is a function of the material and the thickness of the absorber layer, but not of the switching state of the reflector.

To ensure a color that is as neutral as possible in the transparent mode of the switchable absorber element on the one hand, and to ensure the largest possible broadband absorption in the blocking mode on the other hand, the optical path length between front side reflection layer and rear side reflection layer provided by the absorber layer has to be as small as possible. In a preferred embodiment, the optical path length between front side reflection layer and rear side reflection layer is thus less than 200 nm at least for light impinging perpendicularly onto the cell.

In an advantageous embodiment, the optical path length between front side reflection layer and rear side reflection layer is less than 100 nm at least for light impinging perpendicularly onto the cell.

In a further advantageous embodiment, the boundary surface between absorber layer and front side reflection layer has a reflectivity of at least 10%.

It has furthermore proven to be advantageous when the absorber layer has amorphous germanium and/or an alloy based thereon.

In an alternative embodiment, the absorber layer has transition metal dichalcogenides (TMDSc) and/or other metal-based semiconductor materials, such as, for example, $MoS_2$, $WS_2$, $MoSe_2$, $WSe_2$, $SnS_x$, $MoO_x$.

In a further advantageous embodiment, the absorber layer itself has a switchable absorption, as a result of which the switchable stroke is further increased.

The described embodiments effect, among other things, optimizations in the energy yield when the switchable absorber element is embodied to be photoelectrically active.

An inventive photovoltaic cell is characterized in that the photovoltaic cell has an inventive absorber element, wherein the solar cell furthermore has charge carrier-selective electrodes and at least one front side electrode and at least one rear side electrode. The absorber layer, which is designed to be photoelectrically active, is arranged between the front side electrode and the rear side electrode.

It has proven to be advantageous when the photovoltaic cell has further electrodes for removing the created electric current.

A further advantageous embodiment of the photovoltaic cell is characterized in that at least one of the layers of the absorber layer, of the front side reflection layer, and/or of the rear side reflection layer is structured three-dimensionally. In the case of thin layer solar cells, a structuring of the different layers can take place, for example, by means of laser lines, in order to attain an electrical series connection of individual cells strips of the photovoltaic cell, and to thus generate a higher voltage instead of a high current.

The at least one switchable reflection layer can be based on electrochromic, gasochromic, thermochromic, or photochromic materials. Liquid crystals or chiral materials are also possible as basis. The at least one switchable reflection layer can in particular have a multilayer stack, wherein the layers contain one or several of the above-mentioned switchable materials, optionally supplemented by additional catalytic layers, and in the case of electrochromic materials, supplemented by electrode layers, for example ITO layers. It is generally irrelevant, however, how exactly the at least one switchable reflection layer is constructed.

In a further advantageous embodiment, at least one of the reflection layers is based on an electrochromic material, wherein this reflection layer has a common electrode with the photovoltaic cell. An electrode can be saved thereby.

Further advantages, characteristics, and advantageous further developments of the invention follow from the subclaims and from the following description of exemplary embodiments on the basis of the illustrations.

DETAILED DESCRIPTION OF SPECIFIC EMBODIMENTS

Figure 1:
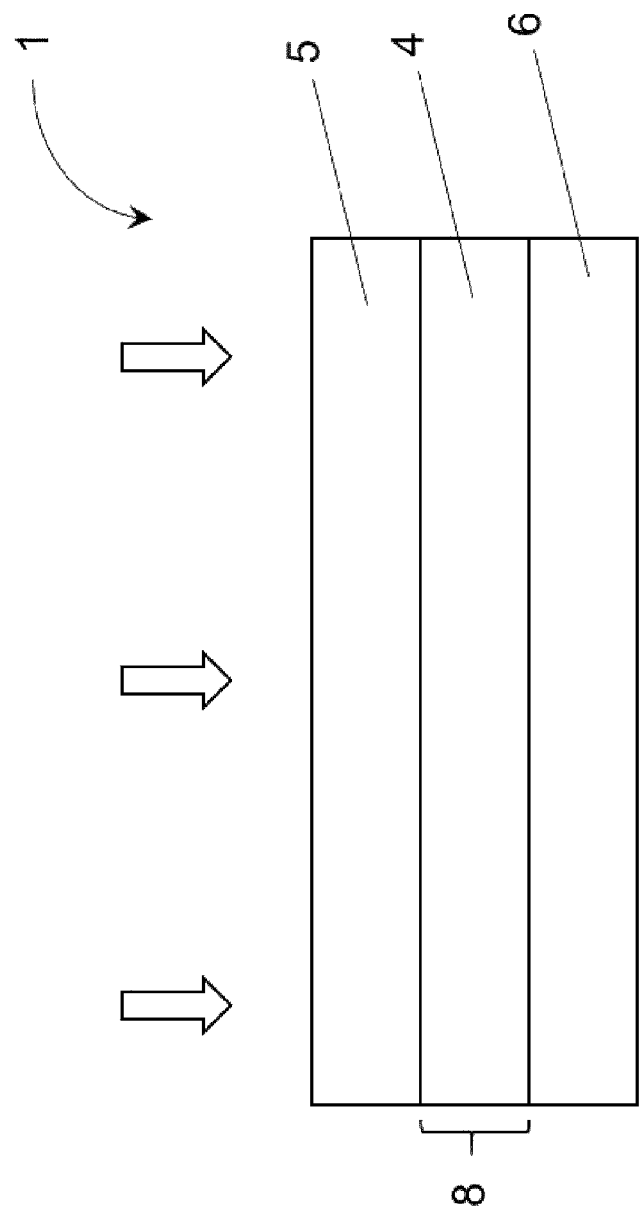
FIG. 1 shows the general setup of an absorber element according to the invention.

FIG. 1 shows the general setup of an absorber element 1 according to the invention. Light impinges virtually perpendicularly onto the absorber element 1, as suggested by the three wide arrows. The absorber element 1 has a front side reflection layer 5 and a rear side reflection layer 6. An absorber layer 4 is arranged between the front side reflection layer 5 and the rear side reflection layer 6. The absorber layer 4 has a thickness, which is dimensioned such that the optical path length between front side reflection layer 5 and rear side reflection layer 6 is less than 400 nm at least for light impinging perpendicularly onto the cell. Broadband resonances or stationary waves or multiple reflections, respectively, are then created between the reflecting front side reflection layer 5 and rear side reflection layer 6. Compared to the simple pass-through of the layer, this results in a multiplied absorption. The absorber layer 4 thus forms a resonator 8. The absorber layer 4 can thereby consist of a single layer or a layer stack of different layers. At least one of the reflection layers (front side reflection layer 5 and/or rear side reflection layer 6) has a switchable reflectivity.

Figure 2:
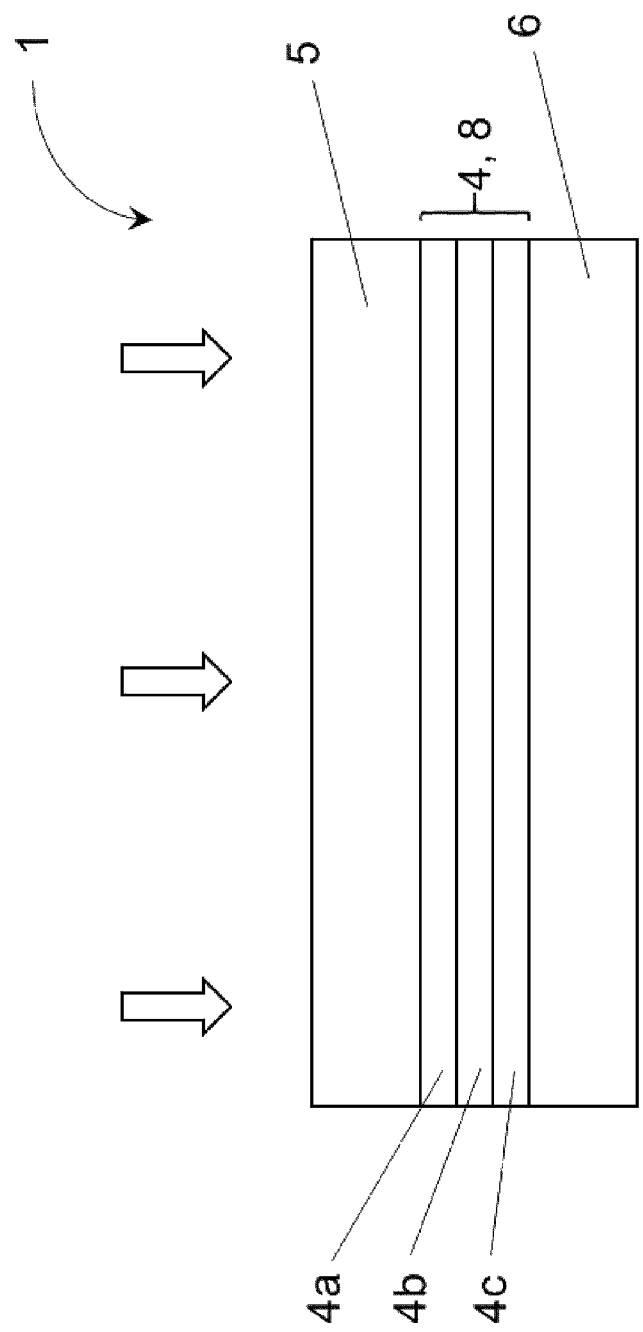
FIG. 2 shows an exemplary embodiment of an absorber element according to the invention comprising a germanium absorber layer.

FIG. 2 shows an exemplary embodiment of an absorber element 1 according to the invention comprising a germanium absorber layer 4. The front side reflection layer 5 is molded as metal-grid structure, in particular of silver, in which the metal only covers a small portion of the surface of the absorber element 1, for example 10%, while a further layer of a TCO (Transparent Conductive Oxide), in particular of one of the materials ZnO:Al (AZO), Sn2:F (FTO), In2O3:F (ITO) is molded on the front side of this metal grid in such a way that both layers together result in a coverage of the absorption element 1 of at least 80%. Due to the fact that both materials have a high reflectivity, for example at the boundary surface to amorphous or microcrystalline silicon, together they form a front side electrode 2 and simultaneously a front side reflection layer 5 of a thickness of, for example, 80 nm in this case. This front side reflection layer 5 has primarily a refractive index of approx. 2.

The absorber layer 4 is formed as amorphous or microcrystalline germanium layer. The absorber layer 4 thereby consists of a layer stack comprising a first layer 4a on the light incidence side of an amorphous, n-doped silicon alloy with a thickness of approx. 10 nm. A second layer 4b of an amorphous intrinsic germanium alloy with a layer thickness of approx. 3 to 30 nm follows the first layer 4a. A last, third layer 4c has a microcrystalline p-doped silicon alloy with a layer thickness of approx. 10 nm. This layer stack forms the resonator 8 with a refractive index of approx. 3.5 to 4.5.

The absorber element 4 is completed by a switchable rear side reflection layer 6, which is formed to be flat.

In this embodiment, the n-layer is formed as part of the interior of the resonator 8, in that its refractive index is essentially similar to that of the adjacent second layer 4b of the absorber layer.

Figure 3:
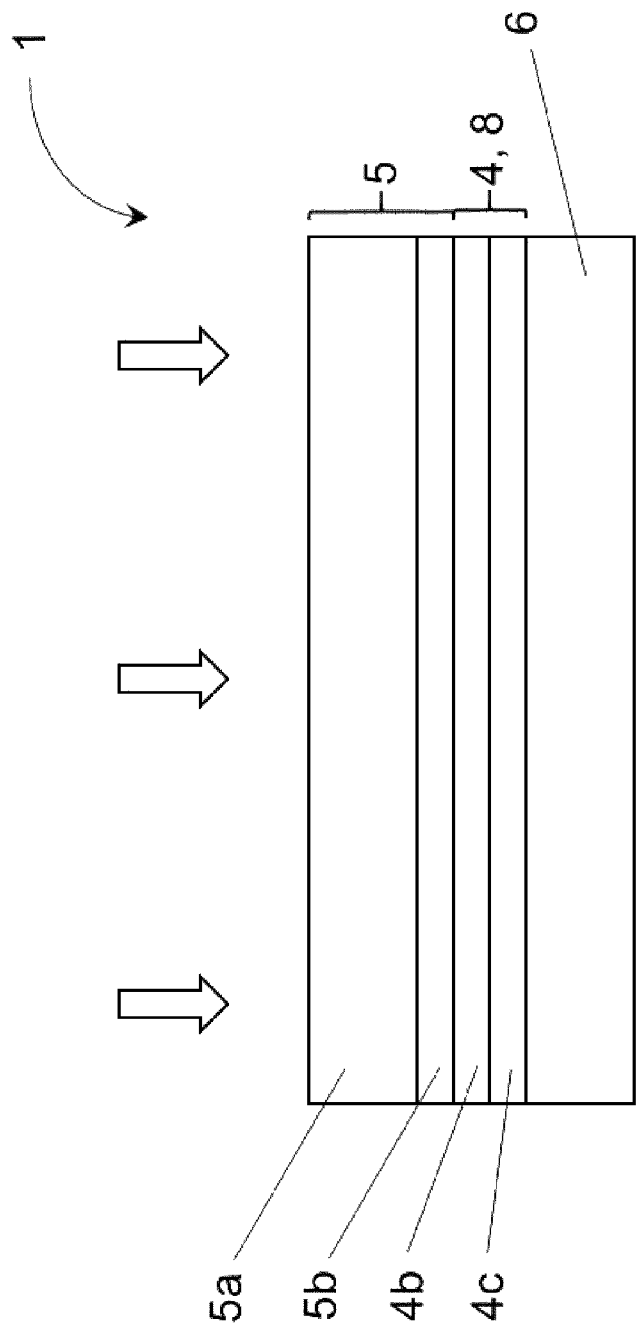
FIG. 3 shows an exemplary embodiment of an absorber element according to the invention comprising a switchable rear side reflection layer comprising an n-layer as part of the front side reflection layer.

FIG. 3 shows a switchable absorber element 1 comprising n-layer as part of the front side reflection layer 5. The setup thereby corresponds to the setup of the previously shown exemplary embodiment with the difference that the n-layer is not first layer 4a of the absorber layer 4 and thus of the resonator 8, but second layer 5b of the front side reflection layer 5, in that the refractive index of the second layer 5b of the front side reflection layer differs significantly from that of the second layer 4b of the absorber layer. Here, the resonator 8 only consists of the second layer 4b of an amorphous intrinsic germanium alloy with a layer thickness of approx. 3 to 30 nm and a last layer 4c, which has a microcrystalline p-doped silicon alloy with a layer thickness of approx. 10 nm. This layer stack forms the resonator 8 with a refractive index of approx. 3.5 to 4.5. In this embodiment, the front side reflection layer 5 consists of a first layer 5a of a TCO (Transparent Conductive Oxide), in particular of an ITO. The front side reflection layer 5 furthermore includes a second layer 5b of an amorphous, n-doped silicon alloy with a thickness of approx. 10 nm. The refractive index of approx. 2 of the front side reflection layer 5 and of approx. 3.5 to 4.5 of the resonator are not affected by this change.

The embodiments shown here only represent examples for the present invention and must thus not be understood to be limiting. Alterative embodiments considered by the person of skill in the art are likewise covered by the scope of protection of the present invention.

The invention claimed is:

1. A switchable absorber element, comprising:
   a photoelectrically active absorber layer;
   a front side reflection layer; and
   a rear side reflection layer;
   wherein the absorber layer is arranged between the front side reflection layer (5) and the rear side reflection layer, wherein the optical path length between the front side reflection layer and the rear side reflection layer is less than 400 nm for light impinging perpendicularly onto the switchable absorber element, wherein at least one of the reflection layers has a switchable reflectivity, wherein the reflection layer with switchable reflectivity is based on materials selected from the group of electrochromic material supplemented by electrode layers, including ITO layers, thermochromic, and photochromic materials, liquid crystals and chiral materials, and wherein a boundary surface between the absorber layer and the front side reflection layer has a reflectivity of at least 10%; and
   wherein the switchable reflectivity of at least one of the reflection layers is configured such that incident light is either transmitted for the most part in a first switching state or absorbed for the most part in a second switching state to create thermal or electrical energy;
   wherein, when the switchable reflectivity of the reflection layers is in a switching state of reflectivity, light passes through the absorber layer repeatedly due to resonances or stationary waves and a shading effect occurs.

2. The switchable absorber element of claim 1, wherein the absorber element is configured to be switched for as long as possible and in a reversible manner with the largest possible stroke.

3. The switchable absorber element of claim 1, wherein a broadband optical resonance forms between the front and rear side reflection layer, as a result of which the absorption in the absorber layer is increased.

4. The switchable absorber element of claim 1, wherein:
   the absorber layer absorbs significantly less than 50% of the impinging light when passing through once;
   resonances or stationary waves or multiple reflections, respectively, are created between the reflection layers, which results in a multiplied absorption compared to a simple pass-through of the absorber layer;
   the switchable reflectivity of at least one of the reflection layers is configured such that the incident light is either transmitted in a first switching state or absorbed in a second switching state to create electrical energy; and
   when the reflectivity of at least one of the reflection layers is not in a switching state of reflectivity, the resonance effects disappear so that this light passes through the absorber layer only once and is transmitted; and
   when the reflectivity of at least one of the reflection layers is in a switching state of reflectivity, a broadband optical resonance forms between the front and rear side reflection layer, so that the absorber layer is passed through repeatedly due to resonances or stationary waves and a shading effect occurs, which increases absorption and increases the stroke.

5. The switchable absorber element of claim 1, wherein an optical path length between the front side reflection layer and the rear side reflection layer is less than 200 nm at least for light impinging perpendicularly onto the cell.

6. The switchable absorber element of claim 1, wherein an optical path length between the front side reflection layer and the rear side reflection layer is less than 100 nm at least for light impinging perpendicularly onto the cell.

7. The switchable absorber element of claim 1, wherein, in wavelength ranges that are reflected by at least one of the reflection layers, the absorber layer has an absorption of at least 5% when passing through once.

8. The switchable absorber element of claim 1, wherein, in wavelength ranges that are reflected by at least one of the reflection layers, the absorber layer has an absorption of at least 10% when passing through once.

9. The switchable absorber element of claim 1, wherein, in wavelength ranges that are reflected by at least one of the reflection layers, the absorber layer has an absorption of less than 30% when passing through once.

10. The switchable absorber element of claim 1, wherein the absorber layer comprises amorphous germanium or an alloy of amorphous germanium.

11. The switchable absorber element of claim 1, wherein the absorber layer comprises a transition metal dichalcogenide (TMDC).

12. The switchable absorber element of claim 1, wherein the absorber layer has a switchable absorption.

13. The switchable absorber element of claim 1, wherein the electrode layers comprise ITO layers.

\* \* \* \* \*